United States Patent
Liu et al.

(10) Patent No.: US 11,978,753 B2
(45) Date of Patent: May 7, 2024

(54) PROCESS TO RELEASE SILICON STRESS IN FORMING CMOS IMAGE SENSOR

(71) Applicant: OMNIVISION TECHNOLOGIES, INC., Santa Clara, CA (US)

(72) Inventors: Yuanliang Liu, San Jose, CA (US); Hui Zang, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 50 days.

(21) Appl. No.: 17/307,789

(22) Filed: May 4, 2021

(65) Prior Publication Data

US 2022/0359581 A1 Nov. 10, 2022

(51) Int. Cl.
*H01L 27/146* (2006.01)

(52) U.S. Cl.
CPC .... *H01L 27/1463* (2013.01); *H01L 27/14612* (2013.01); *H01L 27/14632* (2013.01); *H01L 27/14687* (2013.01)

(58) Field of Classification Search
CPC ........... H01L 27/1463; H01L 27/14612; H01L 27/14632; H01L 27/14687; H01L 27/1469
See application file for complete search history.

(56) References Cited

U.S. PATENT DOCUMENTS

| | | | |
|---|---|---|---|
| 9,076,921 B2* | 7/2015 | Michel | H01L 31/1035 |
| 2007/0257249 A1 | 11/2007 | Mocuta et al. | |
| 2008/0217720 A1* | 9/2008 | Fan | H01L 27/14683 |
| | | | 257/446 |
| 2010/0283093 A1* | 11/2010 | Pei | H10B 12/038 |
| | | | 257/E27.071 |
| 2012/0228677 A1* | 9/2012 | Masuoka | H01L 27/14632 |
| | | | 257/E29.022 |
| 2013/0071992 A1* | 3/2013 | Su | H01L 21/762 |
| | | | 257/E21.561 |
| 2013/0093039 A1* | 4/2013 | Leobandung | H01L 21/76251 |
| | | | 438/459 |
| 2013/0334638 A1 | 12/2013 | Chen et al. | |
| 2014/0035087 A1* | 2/2014 | Liu | H01L 27/1463 |
| | | | 257/443 |
| 2022/0209007 A1* | 6/2022 | Kocon | H01L 29/66727 |

FOREIGN PATENT DOCUMENTS

CN 104701334 * 6/2015

OTHER PUBLICATIONS

Taiwan search report mailed Dec. 21, 2023, issued in related Taiwan Application No. 111114946 filed Jan. 13, 2020, 11 pages.

* cited by examiner

*Primary Examiner* — Albert H Cutler
(74) *Attorney, Agent, or Firm* — Christensen O'Connor Johnson Kindness PLLC

(57) ABSTRACT

Process to release Silicon stress in forming CMOS image sensor. In one embodiment, a method for manufacturing an image sensor includes providing a first wafer that is a semiconductor substrate, where the first wafer has a first side and a second side opposite from the first side. The method also includes attaching a second wafer to the second side of the first wafer. The method further includes forming isolation structures in the second wafer by etching. The isolation structures are bounded by the second side of the first wafer. The method also includes growing an epitaxial layer between individual isolation structures.

15 Claims, 6 Drawing Sheets

PROCESS TO RELEASE SILICON STRESS IN FORMING CMOS IMAGE SENSOR

BACKGROUND INFORMATION

Field of the Disclosure

This disclosure relates generally to the design of image sensors, and in particular, relates to protecting image sensors against dark current.

Background

Image sensors have become ubiquitous. They are widely used in digital still cameras, cellular phones, security cameras, as well as medical, automotive, and other applications. The technology for manufacturing image sensors continues to advance at a great pace. For example, the demands for higher image sensor resolution and lower power consumption motivate further miniaturization and integration of image sensors into digital devices.

As the resolution of image sensors is increased, the spacing between the photodiodes is typically decreased, resulting in narrower and deeper photodiodes. These more closely packed photodiodes are more susceptible to interference by dark current, which in turn leads to interference among the photodiodes and possibly even to photodiode saturation (also known as "white pixel"). Some image sensors include Shallow Trench Isolations (STIs) that limit dark current in the photodiodes. However, the STIs, especially when relatively small in comparison to the overall pixel, may cause stress concentration in the semiconductor materials. Such stress concentration in some cases provide an inception point for crack development and semiconductor dislocation. Over time, the cracks propagate through the semiconductor material and damage the image sensor.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
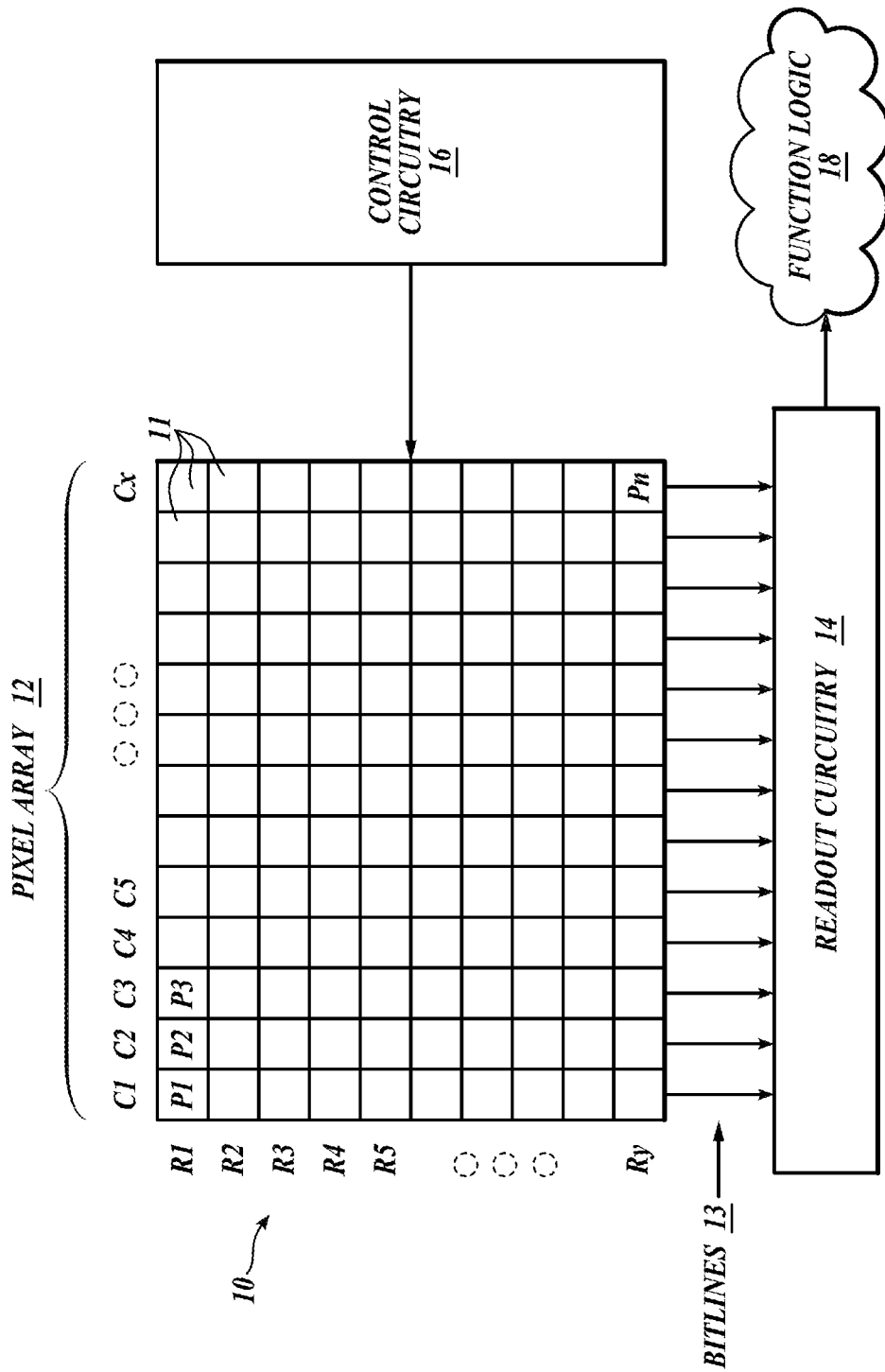
FIG. 1 is a diagram of an example image sensor in accordance with an embodiment of the present technology.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Image sensors, and in particular, image sensors having improved protection against dark current are disclosed. Such sensors may be CMOS (Complementary metal-oxide-semiconductor) sensors. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

In the present disclosure, the terms "semiconductor substrate" or "substrate" refer to any type of substrate used for forming semiconductor devices thereon, including single crystal substrates, semiconductor on insulator (SOI) substrates, doped silicon bulk substrate, and epitaxial film on semiconductor (EPI) substrates and the like. Further, although the various embodiments will be primarily described with respect to materials and processes compatible with silicon-based semiconductor materials (e.g., silicon and alloys of silicon with germanium and/or carbon), the present technology is not limited in this regard. Rather, the various embodiments can be implemented using any types of semiconductor materials.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

Briefly, the embodiments of the present technology are directed to photodiodes (also referred to as pixels) having isolation structures that are less conducive to material dislocation and cracks in semiconductor materials. Such isolation structures may be shallow trench isolation (STI) structures. In operation, isolation structures reduce dark currents in the semiconductors, therefore reducing pixel noise of the optical sensor. However, the presence of the STI structure may by itself also cause dark currents. Therefore, in some embodiments, a size of the STI structure is reduced to reduce the intensity of the dark currents generated by the STI structure. In some embodiments, these relatively small STI structures are buried relatively deep into the silicon substrate, which causes stress concentration at the edges or vertices of the STI structure, which in turn may lead to material dislocation and crack propagation through the surrounding silicon substrate. Such stress concentration can be reduced using the STI structures that are not buried (e.g., by etching and subsequent material deposition) into the substrate material (e.g., Si.)

In some embodiments, the STI structures are manufactured by depositing a layer of secondary material (e.g., Si oxide) over a primary substrate (e.g., Si wafer), followed by masking and etching portions of the secondary material to form the STI structures. Since the STI structures are not buried into the primary substrate, stress concentration may be avoided or at least reduced. Once the STI structures are formed, an epitaxial layer (e.g., epitaxially grown Si, also referred to as epitaxial layer or Si-EPI) may be deposited over the primary substrate, therefore filling the space between the already formed STI structures. Generally, such addition of the epitaxially grown material eliminates or at least reduces stress concentration. The resulting STI structures, even though having a relatively small size, do not act as stress concentrators, therefore the incidence of material dislocation and crack propagation is reduced.

In some embodiments, the primary substrate (e.g., Si wafer) may be bonded with the secondary material (e.g., Si oxide wafer, also referred to as a second wafer or secondary wafer) prior to masking and etching that produces the STI structures. In other embodiments, the secondary material may be formed over the primary substrate by, for example, semiconductor material depositing methods (e.g., vapor deposition).

FIG. 1 is a diagram of an example image sensor 10 in accordance with an embodiment of the present technology. The image sensor 10 includes a pixel array 12, a control circuitry 16, a readout circuitry 14 and a function logic 18. In one example, the pixel array 12 is a two-dimensional (2D) array of photodiodes or image sensor pixels 11 (e.g., pixels P1, P2 . . . , Pn). In different embodiments, two or more image sensor pixels 11 may be grouped to a plurality of pixel cells. As illustrated, the photodiodes are arranged into rows (e.g., rows R1 to Ry) and columns (e.g., columns C1 to Cx). In operation, the photodiodes acquire image data of a scene, which can then be used to render a 2D image of person, place, object, etc. However, in other embodiments the photodiodes may be arranged into configurations other than rows and columns.

In an embodiment, after each pixel 11 in the pixel array 12 acquires its image charge, the image data is read out by the readout circuitry 14 via bitlines 13, and then transferred to a function logic 18. The readout image data of each pixel 11 collectively constitute an image frame. In various embodiments, the readout circuitry 14 may include signal amplifiers, analog-to-digital (ADC) conversion circuitry and data transmission circuitry. The function logic 18 may store the image data or even manipulate the image data by applying post image effects (e.g., crop, rotate, remove red eye, adjust brightness, adjust contrast, or otherwise). In some embodiments, the control circuitry 16 and function logic 18 may be combined into a single functional block to control the capture of images by the pixels 11 and the readout of image data from the readout circuitry 14. The function logic 18 may include a digital processor, for example. In an embodiment, the readout circuitry 14 may read one row of image data at a time along readout column lines (bitlines 13) or may read the image data using a variety of other techniques, such as a serial readout or a full parallel readout of all pixels simultaneously.

In one embodiment, the control circuitry 16 is coupled to the pixel array 12 to control operation of the plurality of photodiodes in the pixel array 12. For example, the control circuitry 16 may generate a shutter signal for controlling image acquisition. In one embodiment, the shutter signal is a global shutter signal for simultaneously enabling all pixels within the pixel array 12 to simultaneously capture their respective image data during a single data acquisition window. In another embodiment, the shutter signal is a rolling shutter signal such that each row, column or group of pixels is sequentially enabled during consecutive acquisition windows. In another embodiment, image acquisition is synchronized with lighting effects such as a flash. In different embodiments, the control circuitry 16 may be configured to control each of pixels 11 to perform the acquiring operations of one or more dark current pixel frames for image calibration and normal image frames.

In one embodiment, readout circuitry 14 includes analog-to-digital converters (ADCs), which convert analog image data received from the pixel array 12 into a digital representation. The digital representation of the image data may be provided to the function logic 18.

In different embodiments, image sensor 10 may be included into a digital camera, cell phone, laptop computer, or the like. Additionally, image sensor 10 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to the image sensor 10, extract image data from the image sensor 10, or manipulate image data supplied by image sensor 10.

Figure 2:
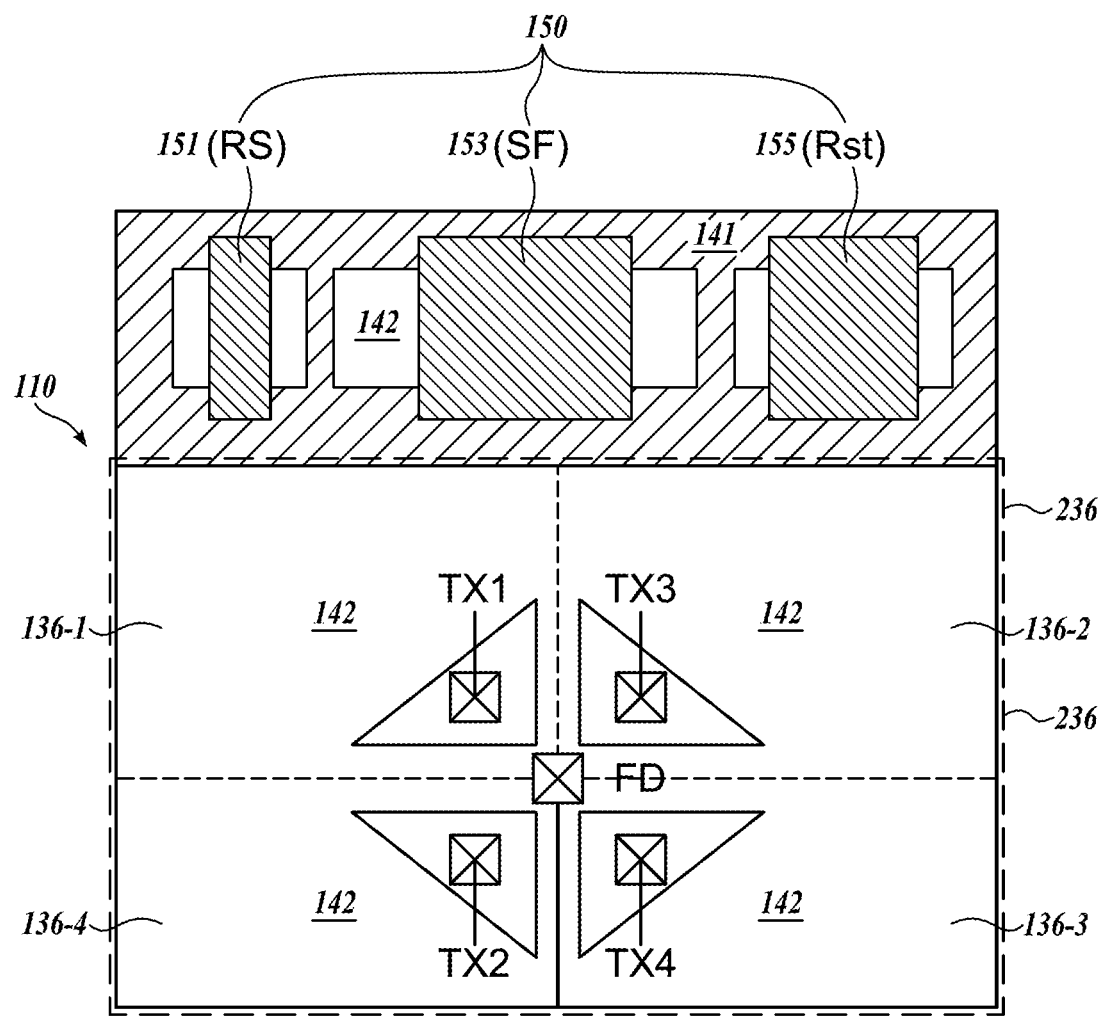
FIG. 2 is a schematic top view of an example pixel in accordance with an embodiment of the present technology.

FIG. 2 is a schematic top view of an example pixel in accordance with an embodiment of the present technology. For simplicity, four photodiodes 136-1, 136-2, 136-3 and 136-4 are illustrated, but in other embodiments pixel 110 may include a larger or smaller number of photodiodes 136. An outer perimeter of the pixel 110 is denoted with numeral 236. Active area of the pixel is denoted by 142. Each photodiode 136-1, 136-2, 136-3, 136-4 (collectively referred to as "136-i" or "136") may include an N-type doped region formed by implanting dopants of N-type, such as arsenic (As) and phosphorus (P), into the P-type epitaxial region. In some embodiments, the polarity can be reversed, for example, pixel 110 may include a P-type doped region formed within an N-type epitaxial region for accumulating holes as electrical charges.

In the illustrated embodiment, a row of transistors is arranged on the side of the photodiodes 136-1, 136-2, 136-3 and 136-4. Alternatively, the row of transistors may be arranged along an outer perimeter of the photodiodes 136-1, 136-2, 136-3 and 136-4 of the pixel 110. In some embodiments, the row of transistors may include a row select transistor (RS) 151, a source follower transistor (SF) 153, and a reset transistor (Rst) 155 (collectively, transistors 150). In other embodiments, the electrical charge of the photodiodes 136-1, 136-2, 136-3 and 136-4 may be managed with a larger or smaller number of transistors, and also different types of transistors depending on the pixel circuit configuration. In operation, the transistors 150 may be powered from a voltage node (e.g., VDD).

The row of transistors 150 may be partially surrounded by isolation structures (e.g., shallow trench isolations or STIs) 141 to at least partially separate the illustrated transistors 150 and photodiodes 136 from the next group of the photodiodes 136 (not shown), therefore reducing the dark current. As explained above, reducing the dark current reduces the incidence of pixel saturation ("white pixel") and improves accuracy of the pixel readout. Transfer transistors TX1-TX4 (also referred to as vertical transfer gates) control charge transfer from the photodiodes 136 to the readout circuitry 14. In some embodiments, such isolation structures may be shallow trench isolation (STI).

Figure 3:
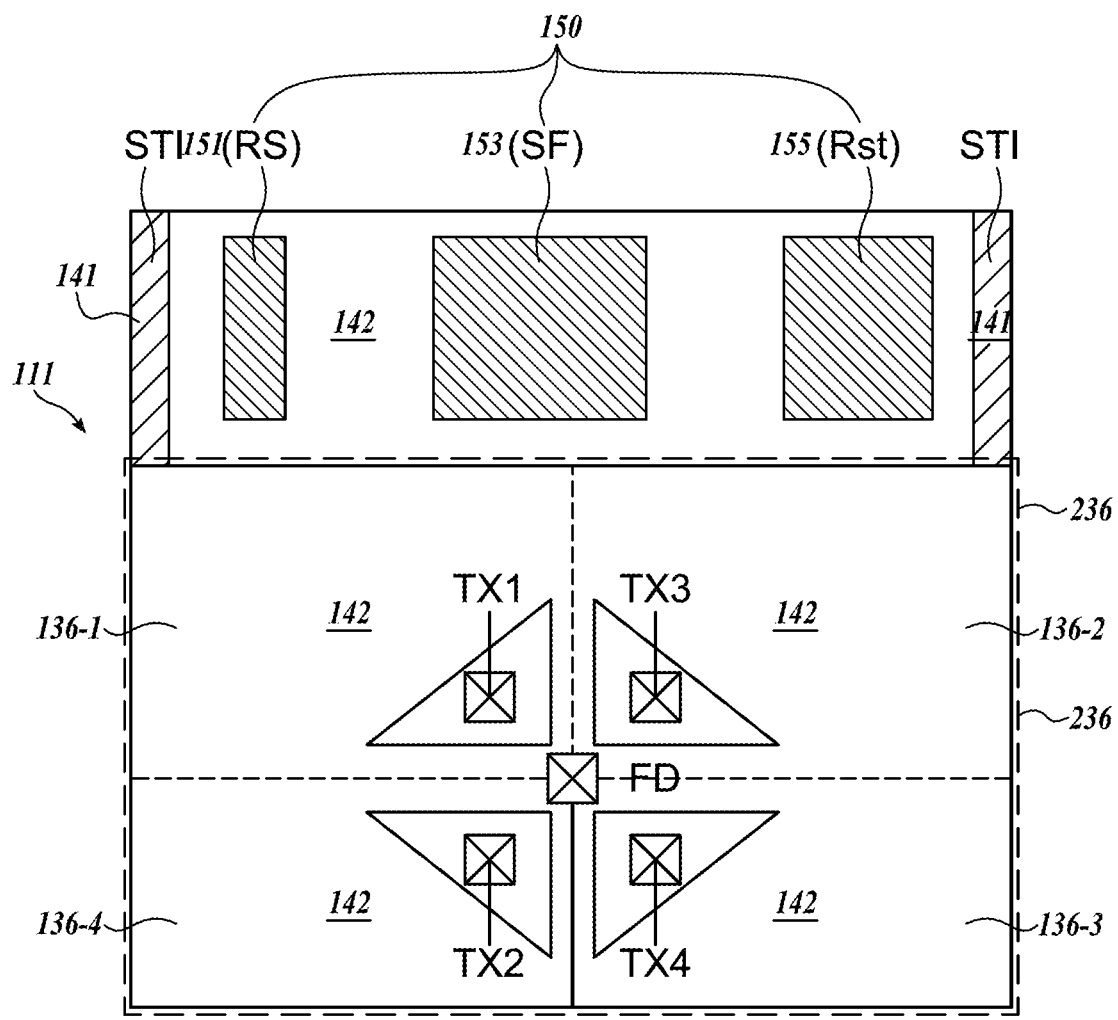
FIG. 3 is a schematic top view of an example pixel in accordance with an embodiment of the present technology.

FIG. 3 is a schematic top view of an example pixel in accordance with an embodiment of the present technology. As explained above, the presence of isolation structures 141 may by itself induce dark current. Therefore, in some embodiments a size of the isolation structures (e.g., STI 141) is reduced in order to reduce dark current of the image sensor. In some embodiments, the STI 141 with reduced size may be referred to as a partial STI pattern. FIG. 3 illustrates a nonlimiting example of such partial STI pattern.

In some embodiments, the STI's 141 and the transistors 150 may be laterally coextensive. In some embodiments, the STI's 141 may laterally bracket the transistors 150 on both sides of the row of transistors 150. In other embodiments, the STI's 141 may isolate the transistors 150 on the side of the row of transistors 150 proximate to photodiodes 136, with a corresponding deep trench isolation (DTI) structure from an adjacent pixel to provide an isolation structure at the opposite side of the transistors 150.

However, these STI structures may in turn induce stresses in the semiconductors of the image sensor, which in turn cause material dislocation and crack propagation. A non-limiting example of such crack propagation is illustrated with reference to FIG. 4 below.

Figure 4:
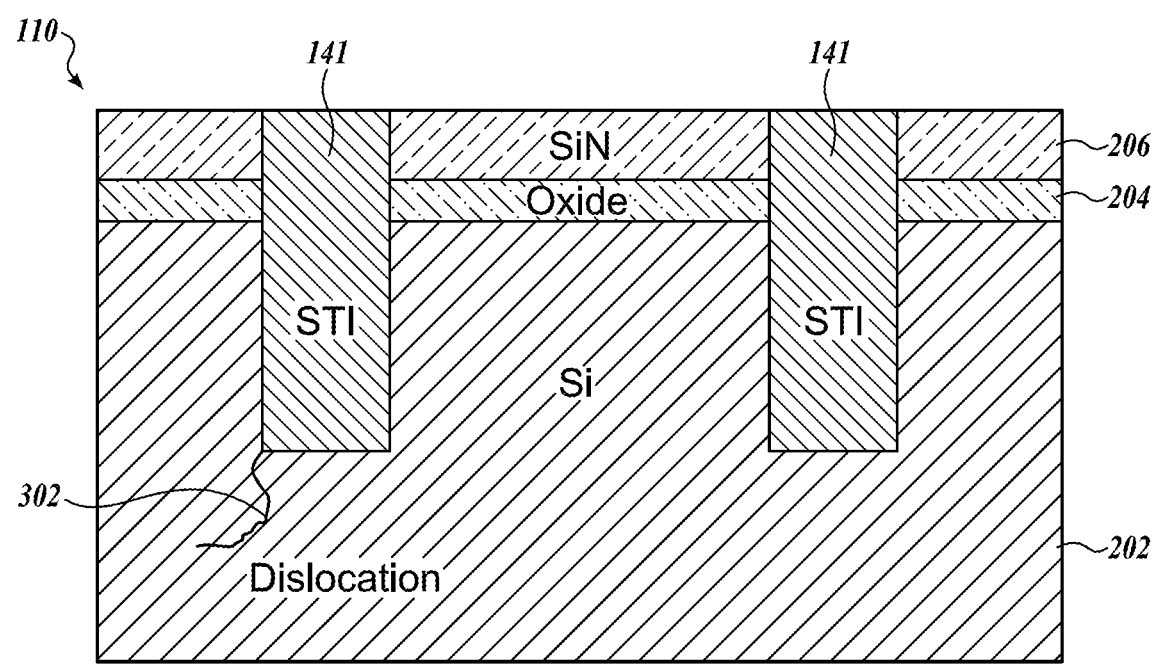
FIG. 4 is a side cross-sectional view of isolation structure in accordance with an embodiment of the present technology.

FIG. 4 is a side cross-sectional view of isolation structures 141 in accordance with an embodiment of the present technology. In some embodiments, the isolation structures 141 may be STIs. In the illustrated embodiment, the STI 141 extends through a hard oxide layer 206, an oxide layer 204 and a substrate 202. In some embodiments, the hard oxide layer 206 is a SiN layer. During manufacturing, such hard oxide layer 206 limits a depth of material removal imparted by chemical-mechanical planarization, therefore protecting the lower layers of material against excessive material removal.

The oxide layer 204 (e.g., Si-oxide or SiO2) separates the hard oxide layer 206 from the substrate 202 (e.g., Si wafer). In different embodiments, the oxide layer 204 improves electrical isolation between electrical components (e.g., transistor gates, not shown) and the substrate 202. Furthermore, the oxide layer 204 may reduce the stress mismatch between a relatively stiff oxide layer 206 and the substrate 202 (e.g., Si wafer). The STI's 141 may be manufactured by etching an opening through the layers 206-202, followed by depositing isolation material into the etched opening. In some embodiments, the material of the STI's 141 is an oxide, for example, a Si-oxide (SiO2). After forming the STI's, excess material may be removed by chemical-mechanical planarization, where the hard oxide layer 206 acts to limit an excessive depth of the material removal.

In many embodiments, a relatively narrow and deep shape of the STI 141 generates stress concentrators in the substrate 202. These stress concentrators promote material dislocation and initiate cracks 302 in the substrate 202. In time, these initially small cracks may propagate through the substrate 202, therefore damaging the image sensor. Some embodiments of manufacturing process that may reduce the occurrence of the material dislocation and cracks 302 are described with reference to FIGS. 5A-5D below.

Figure 5A:
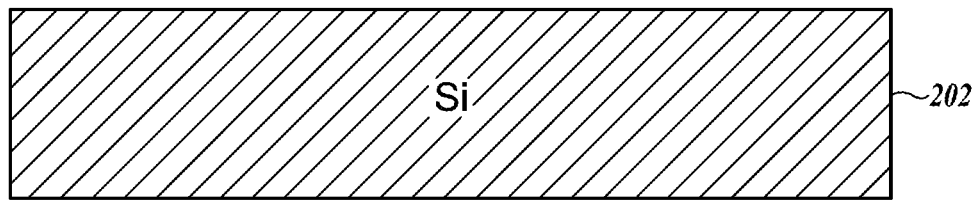
FIGS. 5A-5D illustrate manufacturing process for isolation structure in accordance with an embodiment of the present technology.

FIGS. 5A-5D illustrate manufacturing process in accordance with an embodiment of the present technology. FIG. 5A illustrates a substrate 202, for example, a Si wafer. The substrate 202 is also referred to herein as a primary substrate or a first wafer.

Figure 5B:
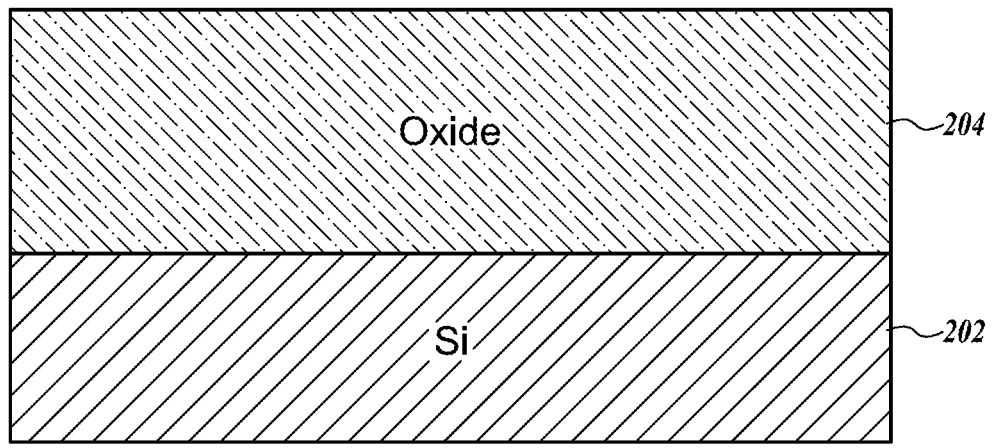

FIG. 5B illustrates a second wafer 204 (e.g., SiO2 wafer or SiO2 layer) attached to the substrate 202. In some embodiments, the second wafer 204 may be formed over the substrate 202 by chemical vapor deposition. In other embodiments, the oxide layer 204 may be a wafer that is bonded with the substrate 202.

Figure 5C:
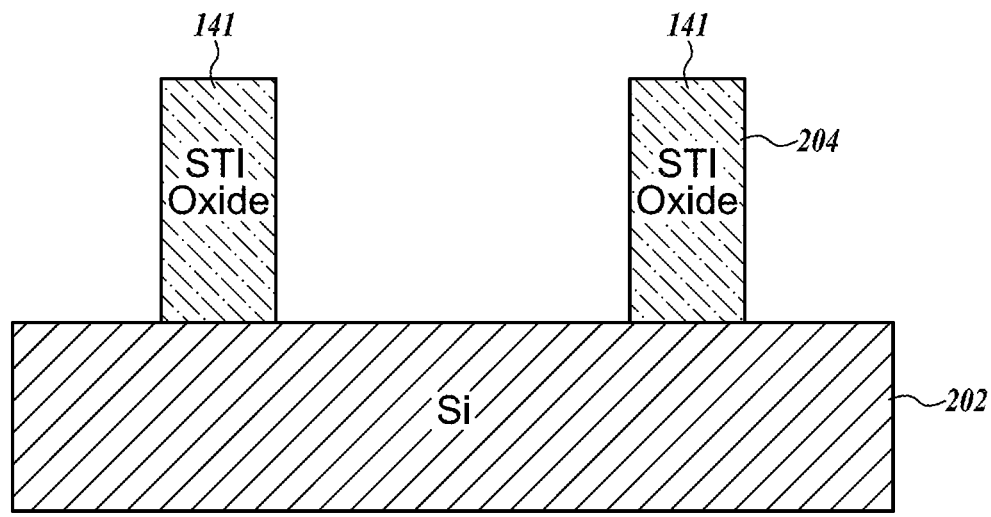

FIG. 5C illustrates the isolation structures 141 (e.g., STIs) that are formed after masking and etching the second wafer 204. Such etching may be, for example, a wet etching process, a dry etching process or a combination of dry and wet etching processes. The resulting isolation structures 141 remain attached to the substrate 202, but without creating stress concentration at the corners of the isolation structures.

Figure 5D:
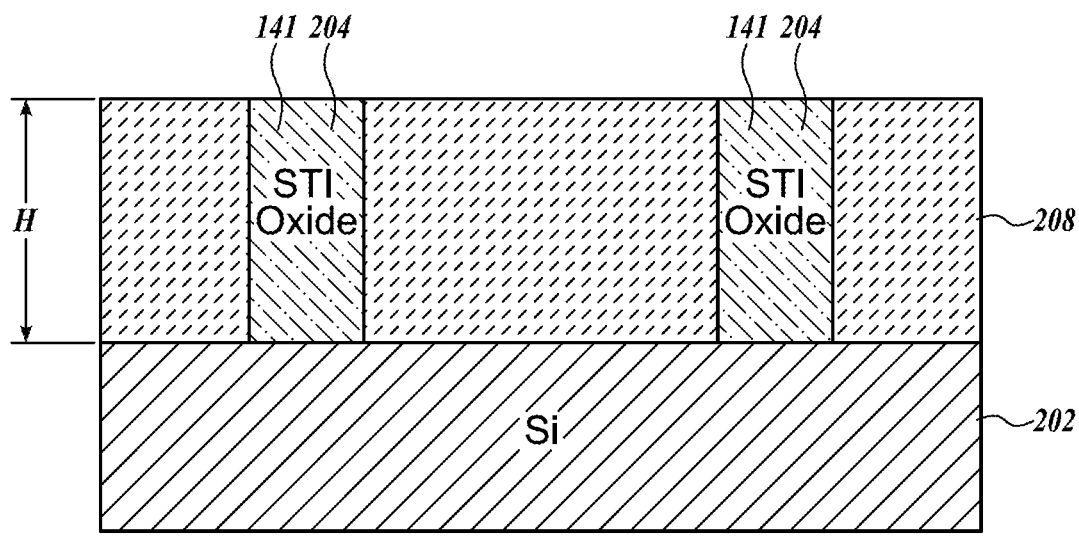

FIG. 5D illustrates the isolation structures 141 surrounded by epitaxial layer 208. In different embodiments, the epitaxial layer 208 may be deposited over the substrate 202 by growing a layer of single-crystal silicon over a single-crystal silicon substrate 202. In some embodiments, the epitaxial layer 208 may be deposited by chemical vapor deposition, which is a process of forming a non-volatile solid film on a substrate from reactions of the appropriate chemical precursors. Some examples of such chemical precursors are $SiCl_4$ (e.g., applied at 1150-1250° C.), $SiHCl_3$ (e.g., applied at 1100-1200° C.), $SiHCl_2$ (e.g., applied at 1050-1150° C.) and $SiH_4$ (applied at less than 1050° C., e.g., 950° C.). In some embodiments, height (H) of the epitaxial layer 208 corresponds to height of the isolation structures 141.

In general, the stresses between the resulting epitaxial layer 208 and other materials like the substrate 202, the STI 141, and other materials (not shown) are reduced or eliminated, thus reducing or eliminating the material dislocations and crack propagation. Furthermore, the combination of the isolation structures 141 and the epitaxial layer 208 eliminates or at least reduces stress concentrators in the semiconductor layers.

Many embodiments of the technology described above may take the form of computer- or controller-executable instructions, including routines executed by a programmable computer or controller. Those skilled in the relevant art will appreciate that the technology can be practiced on computer/controller systems other than those shown and described above. The technology can be embodied in a special-purpose computer, application specific integrated circuit (ASIC), controller or data processor that is specifically programmed, configured or constructed to perform one or more of the computer-executable instructions described above. Of course, any logic or algorithm described herein can be implemented in software or hardware, or a combination of software and hardware.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize. In the context of this specification, the term "approximately" or "about" means +/−5% of the stated value.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A method for manufacturing an image sensor, comprising:
   providing a first wafer that is a semiconductor substrate, wherein the first wafer is a Si wafer that is a primary wafer configured for forming semiconductor devices, and wherein the first wafer has a first side and a second side opposite from the first side;
   bonding a second wafer directly to the second side of the first wafer;
   masking and etching the second wafer to remove material of the second wafer around isolation structures in the second wafer, wherein the isolation structures are formed by the etching, and wherein the isolation structures are bounded by the second side of the first wafer;
   growing an epitaxial layer between formed individual isolation structures;
   forming a plurality of photodiodes within an outer perimeter of an active area of a pixel; and
   forming a plurality of transistors proximate to the isolation structures and outside of the outer perimeter of the active area of the pixel;
   wherein the isolation structures are configured laterally with respect to the plurality of transistors, wherein the isolation structures terminate at the outer perimeter of the active area of the pixel, and wherein an interior of the outer perimeter of the active area of the pixel is free from additional isolation structures.

2. The method of claim 1, wherein the isolation structures are shallow trench isolation (STI) structures.

3. The method of claim 1, wherein the epitaxial layer is grown from the second side of the semiconductor substrate.

4. The method of claim 3, wherein a height of the epitaxial layer corresponds to a height of the isolation structures.

5. The method of claim 1, wherein the epitaxial layer is an epitaxial Si layer.

6. The method of claim 5, wherein the second wafer is a Si oxide wafer.

7. The method of claim 1, wherein bonding the second wafer comprises bonding a silicon oxide ($SiO_2$) wafer to the second side of the first wafer.

8. An image sensor, comprising:
   a plurality of pixels arranged in rows and columns of a pixel array of a first wafer that is a semiconductor substrate, each pixel comprising a plurality of photodiodes within an outer perimeter of an active area of a given pixel, wherein the first wafer is a Si wafer that is a primary wafer configured for forming semiconductor devices, the first wafer having a first side and a second side opposite from the first side;
   a plurality of transistors disposed proximately to the plurality of pixels and outside of the outer perimeter of the active area; and
   a plurality of isolation structures arranged proximately to the plurality of transistors in a second wafer, wherein the first wafer and the second wafer are directly bonded at the second side of the first wafer;
   wherein the isolation structures are configured within an epitaxial layer by masking and etching the second wafer to remove material of the second wafer around isolation structures in the second wafer, wherein the isolation structures are formed by the etching, wherein the epitaxial layer is grown between formed individual isolation structures, wherein the isolation structures and the epitaxial layer terminate at an outer side of a semiconductor substrate, wherein the isolation structures terminate at the outer perimeter of the active area, wherein the isolation structures are configured laterally with respect to the plurality of transistors, and wherein an interior of the outer perimeter of the active area is free from additional isolation structures.

9. The image sensor of claim 8, wherein the isolation structures are shallow trench isolation (STI) structures.

10. The image sensor of claim 8, wherein a height of the epitaxial layer corresponds to a height of the isolation structures.

11. The image sensor of claim 8, wherein the epitaxial layer has a first side that is facing the second side of the semiconductor substrate and a second side that is opposite from the first side, and wherein the isolation structures are configured between the first side of the epitaxial layer and the second side of the epitaxial layer.

12. The image sensor of claim 11, wherein the isolation structures laterally contact the epitaxial layer, and wherein the isolation structures contact the second side of the semiconductor substrate.

13. The image sensor of claim 8, wherein the plurality of transistors is bracketed between individual isolation structures.

14. The image sensor of claim 8, wherein the epitaxial layer is an epitaxial Si layer.

15. The image sensor of claim 8, wherein the isolation structures are Si oxide isolation structures.

* * * * *